(12) United States Patent
Shroff et al.

(10) Patent No.: US 8,595,667 B1
(45) Date of Patent: Nov. 26, 2013

(54) VIA PLACEMENT AND ELECTRONIC CIRCUIT DESIGN PROCESSING METHOD AND ELECTRONIC CIRCUIT DESIGN UTILIZING SAME

(71) Applicants: Mehul D. Shroff, Austin, TX (US); Douglas M. Reber, Austin, TX (US); Edward O. Travis, Austin, TX (US)

(72) Inventors: Mehul D. Shroff, Austin, TX (US); Douglas M. Reber, Austin, TX (US); Edward O. Travis, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/661,131

(22) Filed: Oct. 26, 2012

(51) Int. Cl.
*G06F 17/50* (2006.01)
*G06F 9/455* (2006.01)

(52) U.S. Cl.
USPC ............ 716/112; 716/111; 716/119; 716/132; 716/136

(58) Field of Classification Search
USPC .......................... 716/111, 112, 119, 132, 136
See application file for complete search history.

(56) References Cited

U.S. PATENT DOCUMENTS

| | | | | |
|---|---|---|---|---|
| 6,446,873 B1 * | 9/2002 | Geryk | ........................... | 235/487 |
| 6,804,808 B2 * | 10/2004 | Li et al. | ........................... | 716/52 |
| 7,080,329 B1 * | 7/2006 | Teig et al. | ..................... | 716/122 |
| 7,464,352 B2 | 12/2008 | Itoh | | |
| 2004/0063228 A1 * | 4/2004 | Li et al. | ........................... | 438/14 |
| 2006/0156267 A1 * | 7/2006 | Kato | .............................. | 716/13 |
| 2007/0234258 A1 * | 10/2007 | Lee et al. | .......................... | 716/9 |
| 2007/0300195 A1 * | 12/2007 | Li | ..................................... | 716/5 |
| 2009/0228853 A1 * | 9/2009 | Hong et al. | ....................... | 716/9 |
| 2011/0304994 A1 * | 12/2011 | Mair | ............................. | 361/748 |

OTHER PUBLICATIONS

Hall, Gavid, D.R., et al., "Impact of VIA Interactions and Metal Slotting on Stress Induced Voiding", IEEE CDR 46th Annual International Reliability Physics Symposium, Phoenix, 2008, pp. 392-398.
Ogawa, E.T., et al., "Stress-Induced Voiding Under Vias Connected to Wide Cu Metal Leads", IEEE 40th Annual International Reliability Physics Symposium, Dallas, Texas, 2002, pp. 312-321.
Takashima, Y., et al., "Practical Redundant-Via Insertion Method Considering Manufacturing Variability and Reliability", IEICE Transactions on Fundamentals of Electronics, Communications and Computer Sciences, vol. E92-A No. 12, Dec. 1, 2009, Summary of pp. 2962-2970.
U.S. Appl. No. 13/562538, Reber, D.M., et al., "Method for Forming an Electrical Connection Between Metal Layers", filed Jul. 31, 2012.
U.S. Appl. No. 13/562,534, Travis, E.O., et al., "Method for Forming an Electrical Connection Between Metal Layers", filed Jul. 31, 2012.

(Continued)

*Primary Examiner* — Jack Chiang
*Assistant Examiner* — Brian Ngo
(74) *Attorney, Agent, or Firm* — James L. Clingan, Jr.

(57) ABSTRACT

A computer-implemented method for processing an electronic circuit design, a method of placing vias within an electronic circuit, and an electronic circuit produced utilizing such method(s) are disclosed. A method embodiment for processing an electronic circuit design comprises accessing, utilizing a computer, data which represents an electronic circuit design, identifying a via metallization feature associated with at least one interconnect metallization feature of the electronic circuit design utilizing data which represents the electronic circuit design. The described method embodiment further comprises evaluating a spacing design rule check on the via metallization feature of the electronic circuit design utilizing an area occupied by the at least one interconnect metallization feature.

6 Claims, 6 Drawing Sheets

(56) References Cited

OTHER PUBLICATIONS

Srinivasan, J., et al., "The Impact of Technology Scaling on Lifetime Reliability", IEEE, Proceedings of the 2004 International Conference on Dependable Systems and Networks (DSN '04), Sep. 2004.

Lu, Z., et al., "Interconnect Lifetime Prediction under Dynamic Stress for Reliability-Aware Design", IEEE, Mar. 2004, pp. 327-334.

Ye, H., "Numerical Simulation of Stress Evolution During Electromigration in IC Interconnect Lines", Sep. 2003.

U.S. Appl. No. 13/313,179, Shroff, M., et al., "Method of Protecting Against Via Failure and Structure Therefor", filed Dec. 7, 2011.

U.S. Appl. No. 13/285,073, Reber, D.M., et al., "Semiconductor Device With Vias on a Bridge Connecting Two Buses", filed Oct. 31, 2011.

Zhai, C.J., et al., "Stress Modeling of Cu/Low-k BEoL-Application to Stress Migration", IEEE 42nd Annual International Reliability Physics Symposium, Phoenix, 2004, pp. 234-239.

Srinivasan, J., et al., "IBM Research Report, RAMP: A Model for Reliability Aware MicroProcessor Design", Computer Science, RC23048 (W0312-122), Dec. 29, 2003, pp. 1-25.

Bose, P., Power- and Reliability-Aware (Integrated) Design: Challenges and Opportunities, IBM Corporation, T.J. Watson Research Center, USC Talk, Oct. 20, 2005, pp. 1-63.

Borgesen, P., et al., "Stress evolution during stress migration and electromigration in passivated interconnect lines", AIP Conference Proceedings 305, Stress induced phenomena in metallization: Second international workshop, Mar. 29-31, 1993, Austin, TX.

Lienig, J., "Invited Talk: Introduction to Electromigration-Aware Physical Design", Dresden University of Technology, Institute of Electromechanical and Electronic Design (IFTE), ISPD, '06, Apr. 9-12, 2006, San Jose, CA, USA, pp. 39-46.

U.S. Appl. No. 13/562,538 "Method for Forming an Electrical Connection Between Metal Layers", filed Jul. 31, 2012, Office Action—Restriction, mailed Jul. 11, 2013.

\* cited by examiner

FIG. 1

| RULE 1 | AT LEAST 2 VIAS ARE REQUIRED WITHIN THE SAME METAL INTERSECTION FOR A CONNECTION THAT HAS A VIA <= $D_{T1}$ AWAY FROM A METAL PLATE (BUS) WITH A HEIGHT > H1 AND WIDTH > T1 | 202 |
|---|---|---|
| RULE 2 | AT LEAST 2 VIAS ARE REQUIRED WITHIN THE SAME METAL INTERSECTION FOR A CONNECTION THAT HAS A VIA <= $D_{T2}$ AWAY FROM A METAL PLATE (BUS) WITH A HEIGHT > H2 AND WIDTH > T2 | 204 |
| RULE 3 | AT LEAST 2 VIAS ARE REQUIRED WITHIN THE SAME METAL INTERSECTION FOR A CONNECTION THAT HAS A VIA <= $D_{T3}$ AWAY FROM A METAL PLATE (BUS) WITH A HEIGHT > H3 AND WIDTH > T3 | 206 |

VIA PLACEMENT AND ELECTRONIC CIRCUIT DESIGN PROCESSING METHOD AND ELECTRONIC CIRCUIT DESIGN UTILIZING SAME

RELATED APPLICATION(S)

This application is related to U.S. patent application Ser. No. 13/562,534, filed Jul. 31, 2012, titled "METHOD FOR FORMING AN ELECTRICAL CONNECTION BETWEEN METAL LAYERS," naming Edward O. Travis, Douglas M. Reber, and Mehul D. Shroff as inventors, and assigned to the current assignee hereof.

BACKGROUND

1. Field

This disclosure relates generally to the design, implementation and utilization of electronic circuits, and more specifically, to methods for processing an electronic circuit design and placing vias within an electronic circuit design and an electronic circuit produced utilizing such a method(s).

2. Related Art

As linewidths and feature sizes have decreased and interconnect density has increased, a phenomenon known as "stress migration" (also known as "stress-induced voiding" or "cavitation") has become more prevalent. Stress migration causes voids in metallization interconnect lines which degrade electronic circuit performance, eventually leading to open circuit conditions and electronic circuit or device failure. The problem of stress migration is typically attributable to the differing rates of thermal expansion existing between interconnect materials, substrate materials, and inter-level dielectric (ILD) materials and vacancy migration driven by the hydrostatic stress gradient. The thermal expansion coefficients of conducting materials (e.g., aluminum, copper, and the like) may be many times as great as the thermal expansion coefficients of substrate (e.g., silicon) and ILD materials which encase them, particularly low-κ and ultra low-κ ILD materials. Consequently, conducting or "metallization" material expands and contracts at a different rate than surrounding semiconductor and dielectric materials during heating and cooling cycles of semiconductor fabrication processes or electronic circuit use. The vacancies tend to migrate to and collect at vias, thereby leading to void formation, which over time can grow and lead to an open connection, thus leading to circuit failures. The inclusion of redundant vias is one effective method to reduce yield loss related to stress-migration-related failures, but a large number of extremely complex design rules make redundant via insertion a complex and difficult task. There is therefore a need to more accurately determine where to place redundant vias within electronic circuit designs.

Figure 2:
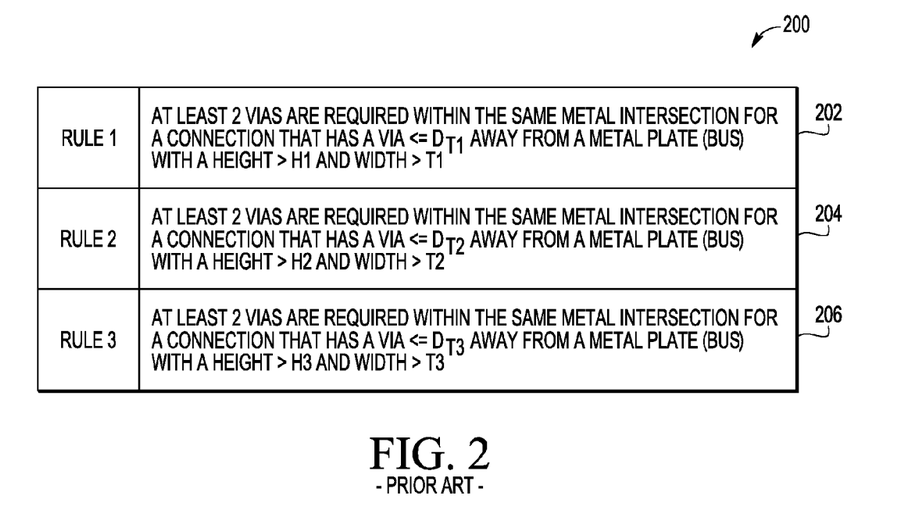
FIG. 2 illustrates a table of conventional fixed threshold distance-spacing design rules for a via metallization feature independently utilizing interconnect metallization feature height and width ranges according to the prior art.
Figure 3:
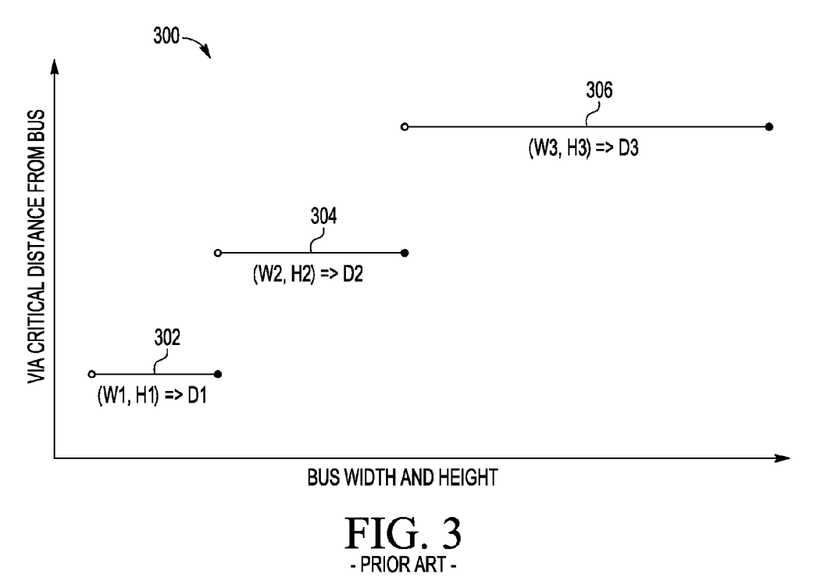
FIG. 3 illustrates a graphical representation of categories of fixed threshold distances as described with reference to FIG. 2 according to the prior art.

FIGS. 2 and 3 illustrate a table of conventional fixed threshold distance-spacing design rules for a via metallization feature independently utilizing interconnect metallization feature height and width ranges and a graphical representation of categories of fixed threshold distances defined using such design rules according to the prior art.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, embodiments of the present inventive subject matter provide various methods; for the processing of an electronic circuit design, for the performance of design rule checking (DRC) as part of electronic design automation (EDA) processing of a proposed physical layout/design of an electronic circuit or device design, and/or for the production or provision of electronic circuits or electronic circuit designs utilizing such design processing and DRC methods; and for electronic circuits produced utilizing such design processing and DRC methods.

EDA tools and DRC are used to verify electronic circuit designs created using so-called "layout" tools to ensure compliance with design rules, to perform layout versus schematic (LVS) checks, parasitic extraction checks, antenna rule checks, and electrical rule checks, as well as to increase reliability and product yield and to increase performance. Major products in the DRC area of EDA include those provided by Mentor Graphics of Willsonville, Oreg., Synopsys of Mountain View, Calif., and Cadence Design Systems of San Jose, Calif. DRC rules typically fall into one of several categories. Width rules specify the minimum width of any shape or feature in an electronic circuit design. Spacing rules specify the minimum distance between two adjacent objects or features. Enclosure rules specify that an object or feature of one type such as a contact or via or at one layer of an electronic circuit design must be covered, with some additional margin, by an object or feature of another type or at another layer. DRC software may provide any of a number of additional types of rules not described herein, e.g., minimum area rules.

Embodiments of the present inventive subject matter provide for the determination or identification of a critical distance "$D_c$" that an "outcast" via metallization feature must be placed from a "bus" interconnect metallization feature. Within the context of the present description, a via metallization feature or "via" comprises an electrical connection between different layers of conductors in a physical electronic circuit or design. Vias typically form a connection path between different interconnect metallization lines (also referred to as leads, metal lines, interconnects, or the like) which are electrically isolated from one another utilizing inter-layer dielectric layers (ILDs), sometimes also referred to as "intermetallic dielectric layers ("IDLs" or "IMDs"). A via connecting the lowest layer of metal to diffusion or poly is typically called a "contact". In some instance the term "plug" is used to refer to the actual physical structure/metallization feature used for connection whereas the inter-layer void accommodating such a plug is labeled as the "via". With the present description, such terms may be used interchangeably. While vias/plugs have been described as monolithic metallization features herein for simplicity, it should be understood that in the actual practice of alternative embodiments of the inventive subject matter described herein such vias may be significantly more complex and may comprise any of a number of component elements (e.g., barrier metals, refractory metals and their silicides, alloys, or the like.

In one or more embodiments of the present inventive subject matter, an electronic circuit design comprising a copper metallization or metallization network which is created using a single or dual damascene process is utilized. Within the electronic circuit/design of the described embodiments, an "outcast" via metallization feature is disposed, per a proposed placing, on a "tab" interconnect metallization feature extending from a bus interconnect metallization feature as will be described in greater detail herein with respect to FIG. 1. A bus interconnect metallization feature and a tab interconnect metallization feature within the present description may comprise any two conductively adjacent interconnect metallization elements where the "bus" is dimensionally wider than the "tab". A bus may comprise any number of tabs and while in a number of embodiments a tab and bus will be orthogonally related to one another, in alternative embodiments, non-orthogonal relationships may also be contemplated. In another embodiment of the inventive subject matter described herein, a bus is provided which is at least twice the dimensional width of an associated tab. As described herein, "width" is understood as the smallest dimension across a shape. Where a tab and bus are orthogonally related, width will also generally be considered as a dimension which is parallel to the direction from which the tab extends from the bus.

In one or more embodiments, an "outcast" via metallization feature is proposed to be placed within or upon a tab of a bus as specified in an electronic circuit design. According to the described embodiment(s), the area of the adjacent bus is used to determine or identify a critical distance "$D_c$" traversed though a bridge metal line from the adjacent bus to a proposed metallization via feature. Such a critical distance may or may not be the distance of a direct, linear path between the adjacent bus and proposed metallization via feature. The critical distance is then used as part of a design rule check or other electronic design automation process operation. In one embodiment, the critical distance is used to determine whether or not a redundant via metallization feature will be included within the electronic circuit design. For example, in one or more embodiments, if a proposed via metallization feature is within the critical distance "$D_c$" and there are no other via metallization features on or otherwise associated with the tab, a DRC may fail and a user indication may be created or displayed indicating this failure, an additional via metallization feature may be automatically created and placed in a location associated with the tab, such an additional via metallization feature may be tentatively presented to a user for confirmation/acceptance, and/or a new recommended location for the originally proposed via metallization feature may be made to a user which is outside the critical distance from the bus.

In one or more embodiments of the present inventive subject matter, a redundant via metallization feature may be placed or provided in a number of alternative ways. For example, a redundant via may be functional, providing substantially identical connectivity as the original "outcast" via metallization feature being evaluated. In other embodiments, such a redundant via may comprise a so-called "decoy" via metallization feature. A decoy via is aligned proximate to, and within a protection region of, the original proposed via metallization feature that is susceptible to failure. Although the decoy via may be connected on one end to a different interconnect layer than that of the via that is susceptible to failure, the two vias have a common connection on the portion of the large bus interconnect metallization feature/layer so that the decoy via provides gettering of vacancies and thus protects the original proposed via metallization feature that is susceptible to failure when vacancies migrate from the large bus interconnect metallization feature.

In one or more embodiments of the present inventive subject matter, the area of/occupied by an associated bus interconnect metallization feature may be determined in a number of alternative ways. In other embodiments, such an area may be provided to an embodiment process, for example a DRC process, rather than being determined or computed directly. In one embodiment, including a tab conductively adjacent to multiple bus interconnect metallization features, an area used to determine a critical distance between one or more of the indicated bus interconnect metallization features and an evaluated via metallization feature includes a cumulative area occupied by all conductively adjacent bus interconnect metallization features. In another embodiment, one or more conductively adjacent bus interconnect metallization features exceed a length "L". In the described embodiment, the length "L" constitutes a threshold length in which the probability that vacancies originating in the bus interconnect metallization feature beyond length "L" will migrate to the associated via metallization feature is below a predetermined (acceptable) threshold.

In yet other embodiments, one or more of the processes described herein may be applied at different metallization network layers independently. Consequently, process resolution, for example the inclusion or suggestion to include additional/redundant via metallization features, DRC failure, etc., would differ at different metallization layer levels in the described alternative embodiment(s). In still another embodiment of the present inventive subject matter, one or more of the process embodiments described herein are applied to an electronic circuit design in response to a determination that an associated/conductively adjacent bus interconnect metallization feature occupies at least a predetermined threshold area. Utilization of such an area threshold embodiment prevents small areas of an electronic circuit design from being overdesigned, which may lead to increased feature footprint and/or changes in parasitic resistance or capacitance which in turn may lead to timing errors.

Figure 1:
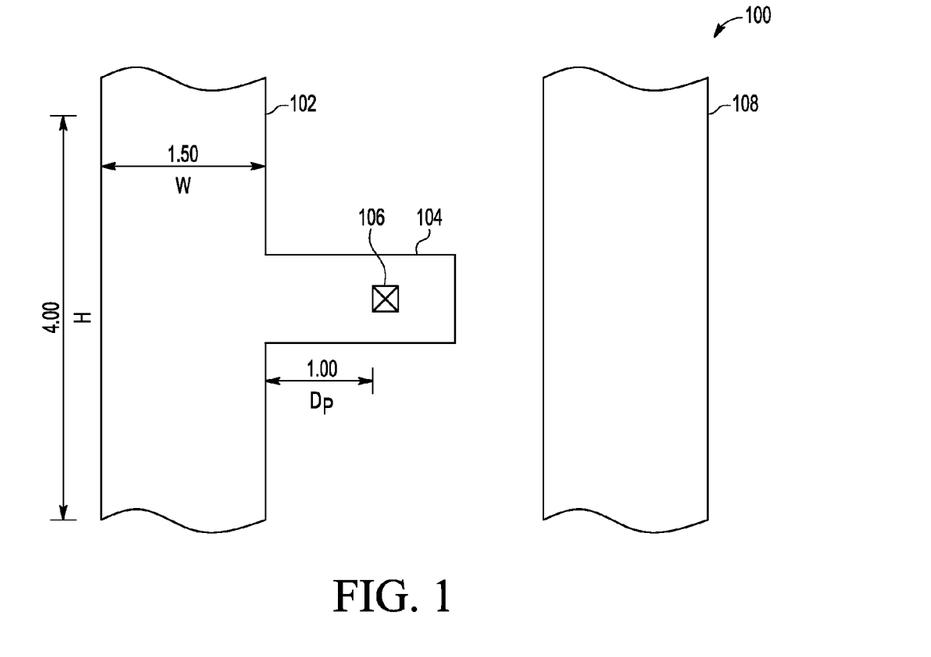
FIG. 1 illustrates a top view of an electronic circuit design according to an embodiment of the present invention.

FIG. 1 illustrates a top view of a portion of an electronic circuit design 100 according to an embodiment of the present invention. Electronic circuit design 100 includes a "bus" or bus interconnect metallization feature 102 having a "tab" or tab interconnect metallization feature 104 extending laterally therefrom. Tab interconnect metallization feature 104 has a "via" or via metallization feature 106 disposed thereon as shown. Electronic circuit design 100 further includes an additional bus interconnect metallization feature 108 as depicted. Bus interconnect metallization feature 108 prevents tab interconnect metallization feature 104 from extending beyond its boundary without becoming conductively coupled with bus interconnect metallization feature 108. In other embodiments, additional bus interconnect metallization features may be provided in an electronic circuit design which are conductively coupled/adjacent to a tab such as tab interconnect metallization feature 104 as will be described herein in greater detail.

Bus interconnect metallization feature 102 has a width physical dimension "W" or "width" and a height physical dimension "H" or "height" as shown. The height and width dimensions described are utilized to determine an area "A" occupied by bus interconnect metallization feature 102. This area is then used, according to one or more embodiments, to determine whether a proposed distance "$D_p$" between bus interconnect metallization feature 102 and via metallization feature 106 is greater than or equal to a critical distance sufficient to ensure that the likelihood of a stress-migration-related failure of via metallization feature 106 is below a predetermined threshold.

In response to a determination that the proposed distance "$D_p$" is less than such a critical distance one or more responses may be provided according to specific inventive embodiments. In one embodiment, the described determination is performed as part of a design rule check with the result being an indication of DRC failure. In one or more alternative embodiments, recommendations such as to include a redundant via metallization feature or to move the proposed via metallization feature beyond the determined threshold critical distance may be made. Alternatively, a correction, which may be the inclusion of an additional redundant via metallization feature, may be automatically performed in conjunction with electronic circuit design creation or layout software. In one embodiment, a redundant via metallization feature is either suggested or automatically placed within electronic circuit design 100 on tab interconnect metallization feature 104 in that portion between via metallization feature 106 and bus interconnect metallization feature 102.

FIG. 2 illustrates a table of conventional fixed threshold distance-spacing design rules for a via metallization feature independently utilizing interconnect metallization feature height and width ranges according to the prior art. In the embodiment of FIG. 2, a design rule set 200 includes multiple design rules 202-206 which correspond to bus interconnect metallization features or "plates" falling within distinct height/width ranges.

A height/width range or group within design rule set 200 corresponds to a metal intersection including a bus interconnect metallization feature having a height physical dimension greater than a height H1, and a width physical dimension greater than a width T1, and a design rule 202. Per design rule 202, at least two via metallization features (e.g., one via and one redundant via) are required in the metal intersection for a connection including a via metallization feature on the tab interconnect metallization feature within (i.e., less than or equal to) a predetermined length or distance, $D_{T1}$, of the bus interconnect metallization feature for rule compliance. Within the presently described embodiment, a "metal intersection" comprises a portion of the tab interconnect metallization feature between the edge of the via metallization feature being evaluated (i.e., the most distant via from the bus interconnect metallization feature) and the physical intersection of the bus and tab. In DRC terms, an intersection comprises the Boolean "and" of two metallization (e.g., a combination of upper and lower metal) layers, and any shape that results, including a via inside that shape.

Another height/width range or group within design rule set 200 corresponds to a metal intersection including a bus interconnect metallization feature having a height physical dimension greater than a height H2, and a width physical dimension greater than a width T2, and a design rule 204. Per design rule 204, at least two via metallization features are required in the metal intersection for a connection including a via metallization feature on the tab interconnect metallization feature within (i.e., less than or equal to) a predetermined length or distance, $D_{T2}$, of the bus interconnect metallization feature for rule compliance.

Yet another height/width range or group within design rule set 200 corresponds to a metal intersection including a bus interconnect metallization feature having a height physical dimension greater than a height H3, and a width physical dimension greater than a width T3, and a design rule 206. Per design rule 206, at least two via metallization features are required in the metal intersection for a connection including a via metallization feature on the tab interconnect metallization feature within (i.e., less than or equal to) a predetermined length or distance, $D_{T3}$, of the bus interconnect metallization feature for rule compliance. It should be noted that between each of the depicted height/width ranges or groups, a threshold distance such as between a bus interconnect metallization feature and a via metallization feature being evaluated is fixed as will be more clearly illustrated with respect to FIG. 3.

FIG. 3 illustrates a graphical representation or graph 300 of categories of fixed threshold distances as described with reference to FIG. 2 according to the prior art. In the depicted embodiment of FIG. 3, threshold or "critical" distance of a via metallization feature is plotted on a vertical axis versus bus interconnect metallization feature height and width ranges plotted on a horizontal axis. Graph 300 includes three height/width ranges 302-306, corresponding to the fixed threshold distance-spacing design rules described and illustrated with respect to FIG. 2. A single via metallization feature may not be placed within the critical distance which is represented by the space beneath the illustrated horizontal lines of FIG. 3 while complying with associated and depicted design rules.

Figure 4:
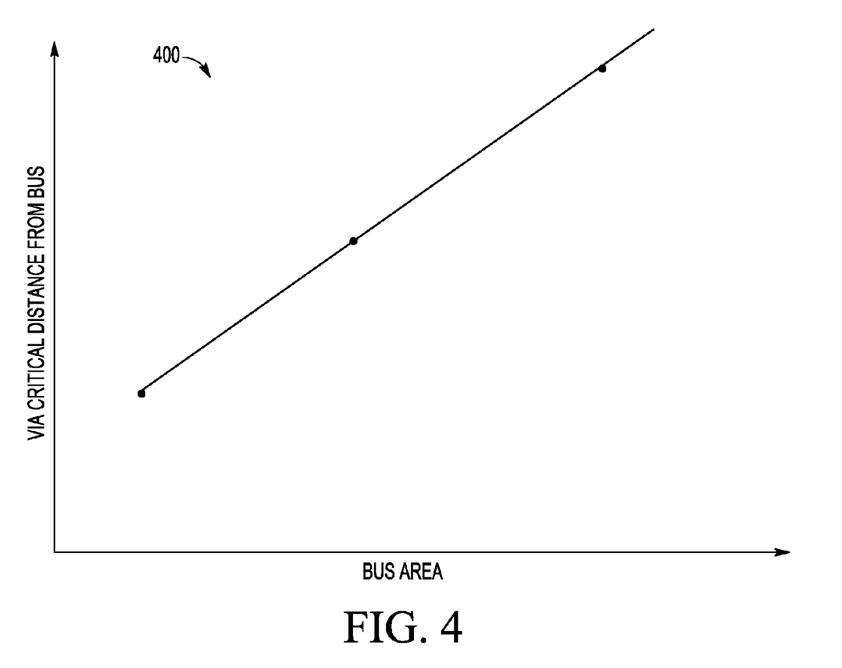
FIG. 4 illustrates a high-level graphical representation of a variable threshold distance-spacing design rule for a via metallization feature utilizing interconnect metallization feature area according to an embodiment of the present inventive subject matter.

FIG. 4 illustrates a high-level graphical representation of a variable threshold distance-spacing design rule for a via metallization feature utilizing interconnect metallization feature area according to an embodiment of the present inventive subject matter. More specifically, FIG. 4 includes a graph 400 of threshold or "critical" distance of a via metallization feature plotted on a vertical axis versus bus interconnect metallization feature area plotted on a horizontal axis. In the particular embodiment of FIG. 4, a linear equation/relationship between via critical distance and versus bus interconnect metallization feature area is depicted. In other embodiments other relationships, such as non-linear relationships, or functions may be implemented to determine or identify via metallization feature critical distance based on bus interconnect metallization feature area. Examples of non-linear relationships include, but are not limited to, quadratic, polynomial, exponential, logarithmic, and power-law.

In one embodiment of the present inventive subject matter, graph 400 is constructed via a function fit technique whereby one or more calibration structures in a physical electronic circuit implementation are evaluated to identify a critical or threshold distance for via placement from a bus interconnect metallization feature of known area. Data indicating this threshold distance is then utilized (e.g., extrapolated) to construct a model from which a function may be identified which relates via metallization feature critical distance from the bus as a function of bus interconnect metallization feature area according to one or more inventive embodiments. In one embodiment, plot points may be utilized as shown of specific critical distances of via metallization features based on bus interconnect metallization feature area to meet one or more predetermined criteria (e.g., probability of stress migration of vacancies found within and adjacent bus interconnect metallization feature(s) to the associated via metallization feature being below a predetermined threshold). Utilization of such techniques as described herein, allow for more accurate placement of one or more via metallization features such as one or more redundant via, particularly in instances where overall area is above or below a threshold which may impact stress-migration-related failures but where a physical dimension, such as height or width, fails to fall within an existing design rule check range.

Figure 5:
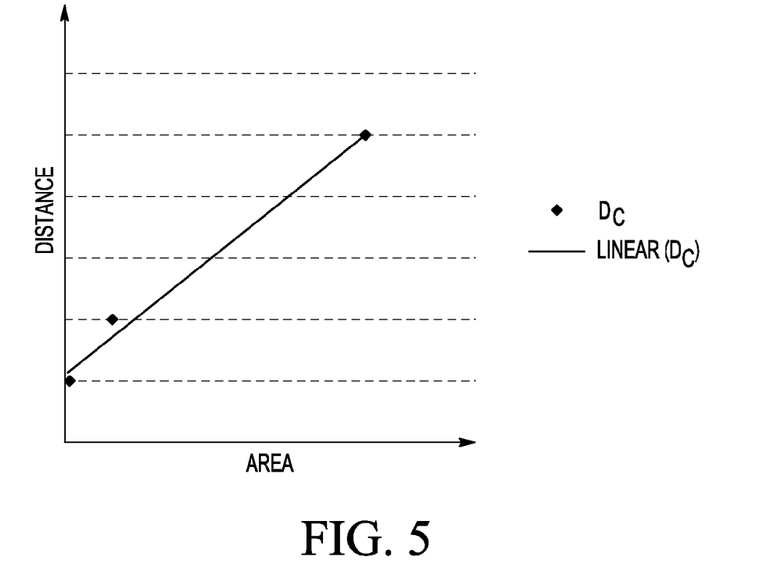
FIG. 5 illustrates at a more specific level a graphical representation of a threshold distance-spacing design rule for an electronic circuit geometry according to an embodiment of the present inventive subject matter.

FIG. 5 illustrates at a more specific level a graphical representation of a threshold distance-spacing design rule for an electronic circuit geometry according to an embodiment of the present inventive subject. More specifically, FIG. 5 represents a graphical representation of variable threshold (i.e., critical) distance for via metallization features from bus interconnect metallization features for a specific electronic circuit geometry. FIG. 5 may correspond to, but is not limited to, any of 90 nanometer, 65 nanometer, 55 nanometer (shrunk), 45 nanometer, 40 nanometer (shrunk), 32 nanometer, and 28 nanometer (shrunk), technology nodes, respectively. Within the present description, the term "shrunk" refers to an electronic circuit implementation created utilizing a "die shrink" technique (sometimes referred to as an "optical shrink" or "process shrink") including scaling of semiconductor devices, (e.g., transistors). The act of "shrinking" creates a substantially identical die or electronic circuit using a different (e.g., more advanced) fabrication process, usually involving an advance of lithographic node.

The graphical representation or "graph" of FIG. 5 includes a threshold or "critical" distance for via metallization features on a vertical or "Y" axis plotted versus bus interconnect metallization feature area on a horizontal or "X" axis as shown. FIG. 5 includes specific via metallization threshold distance plot points and a linear approximation plotted using a linear function including via metallization feature distance and bus interconnect metallization feature area terms represented by Y and X, respectively as well as slope and vertical axis intercept constants as shown. The graphical representation in FIG. 5 further includes a corresponding correlation coefficient for the actual critical or threshold via distances and the linear function approximation. While specific electronic circuit design geometries have been referenced with respect to FIG. 5 for the sake of illustration, in alternate embodiments of the present inventive subject matter any geometry may be utilized.

Figure 6:
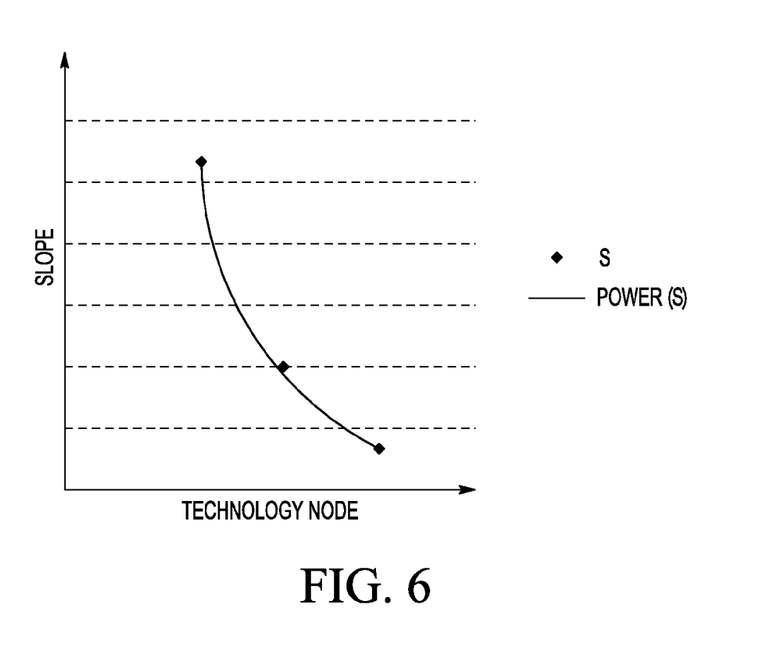
FIG. 6 illustrates an extrapolation of graphical representations of variable threshold distance-spacing design rules of such as depicted in FIG. 5 which are utilized to estimate variable threshold distance-spacing design rules for additional electronic circuit geometries according to additional embodiments of the present inventive subject matter.

FIG. 6 illustrates an extrapolation of graphical representations of variable threshold distance-spacing design rules of such as depicted in FIG. 5 which may be utilized to estimate variable threshold distance-spacing design rules for additional electronic circuit geometries according to additional embodiments of the present inventive subject matter. More specifically, FIG. 6 depicts a "power law" function for various electronic circuit geometries. FIG. 6 includes a plot of via critical distance vs. area slope as illustrated for example in FIG. 5 on a vertical or "Y" axis and plotted versus electronic circuit geometry or "technology node" size. Specific slope plot points and a power-law function and corresponding plot are depicted. Utilizing graphs such as those depicted in FIG. 6, linear functions such as those shown in FIG. 5 may be extrapolated for new node sizes/geometries according to one or more embodiments of the present inventive subject matter.

Figure 7:
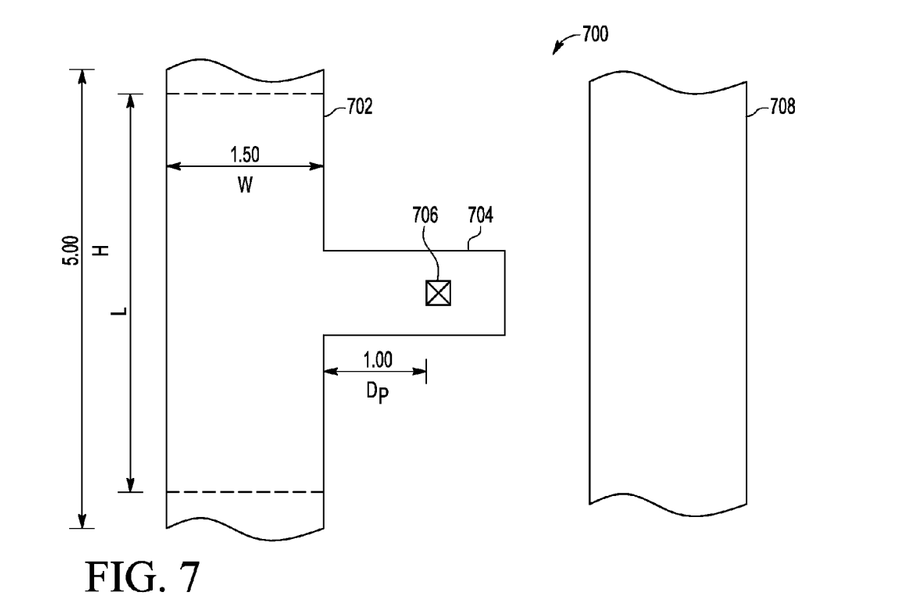
FIG. 7 illustrates a top view of an electronic circuit design comprising a bus interconnect metallization feature having a physical dimension value (height) which exceeds a predetermined physical dimension value which is utilized to determine an area occupied by the bus interconnect metallization feature according to an embodiment of the present invention.

FIG. 7 illustrates a top view of an electronic circuit design comprising a bus interconnect metallization feature having a physical dimension value such as height that exceeds a predetermined physical dimension value which is utilized to determine an area occupied by the bus interconnect metallization feature according to an embodiment of the present invention.

Electronic circuit design 700 includes a "bus" or bus interconnect metallization feature 702 having a "tab" or tab interconnect metallization feature 704 extending laterally therefrom similar to as described with respect to FIG. 1 herein. Tab interconnect metallization feature 704 also has a via metallization feature 706 disposed thereon as shown. Electronic circuit design 700 further includes an additional bus interconnect metallization feature 708 as depicted. Bus interconnect metallization feature 702 has a width physical dimension "W" or "width" and a height physical dimension "H" or "height" as shown. In the embodiment of FIG. 7, the described height physical dimension "H" exceeds a predetermined threshold length "L" as illustrated. In the described embodiment, the length "L" constitutes a threshold length in which the probability that vacancies originating in the bus interconnect metallization feature beyond length "L" will migrate to the associated via metallization feature is below a predetermined (acceptable) threshold. In one embodiment, such a threshold is determined utilizing one or more factors including bus width, technology node, materials, and/or reliability factors such as fail rate, operating temperature, lifetime requirements and the like.

Since vacancies within bus interconnect metallization feature 702 found beyond length "L" are unlikely to migrate to via metallization feature 706 during the lifetime of the circuit, length "L" is used as the height (rather than the full height "H") along with the width dimension "W" to determine an area "A" occupied by bus interconnect metallization feature 702 in the embodiment of FIG. 7. This area is then used, according to one or more embodiments to determine whether a proposed distance "$D_p$" between bus interconnect metallization feature 702 and via metallization feature 706 as previously described herein.

Figure 8:
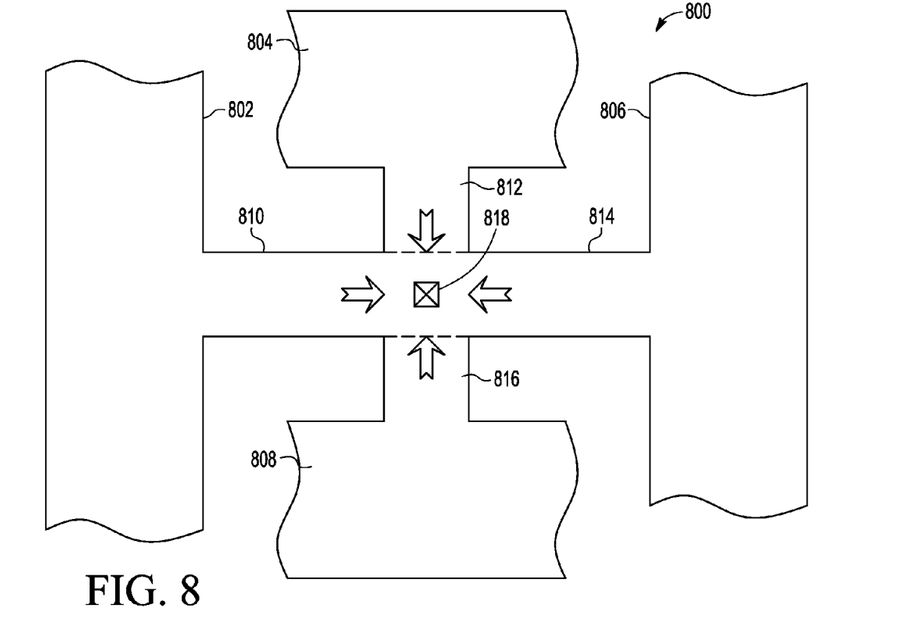
FIG. 8 illustrates a top view of an electronic circuit design including multiple bus interconnect metallization features according to an embodiment of the present invention.

FIG. 8 illustrates a top view of an electronic circuit design including multiple bus interconnect metallization features according to an embodiment of the present invention. Bus interconnect metallization features 802-808 are each associated with tab interconnect metallization features 810-816, respectively in a manner similar to that described previously with regard to bus interconnect metallization feature 102 and tab interconnect metallization feature 104 of FIG. 1. In the embodiment of FIG. 8, a threshold or critical distance is determined or identified based on cumulative area occupied by associated bus interconnect metallization features. In one embodiment, associated bus interconnect metallization features are grouped in metallization layers such that upper, lower, and (if applicable) intermediary bus interconnect metallization layer areas are combined.

More specifically, in the embodiment of FIG. 8, the areas of bus interconnect metallization features 802 and 806 at an "upper" metallization layer are combined to determine an upper metallization layer cumulative area utilized to determine a threshold distance for via metallization feature 818 from each of the respective bus metallization features 802 and 806. Similarly the areas of bus interconnect metallization features 804 and 808 are combined to generate a lower metallization layer cumulative area. These upper and lower metallization layer threshold distances are then utilized to determine whether additional, which may be called redundant, via metallization features are to be placed within tab interconnect metallization features 810-816. In other alternative embodiments of the present inventive subject matter the areas of all adjacent bus interconnect metallization features (e.g., 802-808) may be combined to generate a total area and/or each bus interconnect metallization feature area may be treated/utilized independently to determine a threshold distance.

Figure 9:
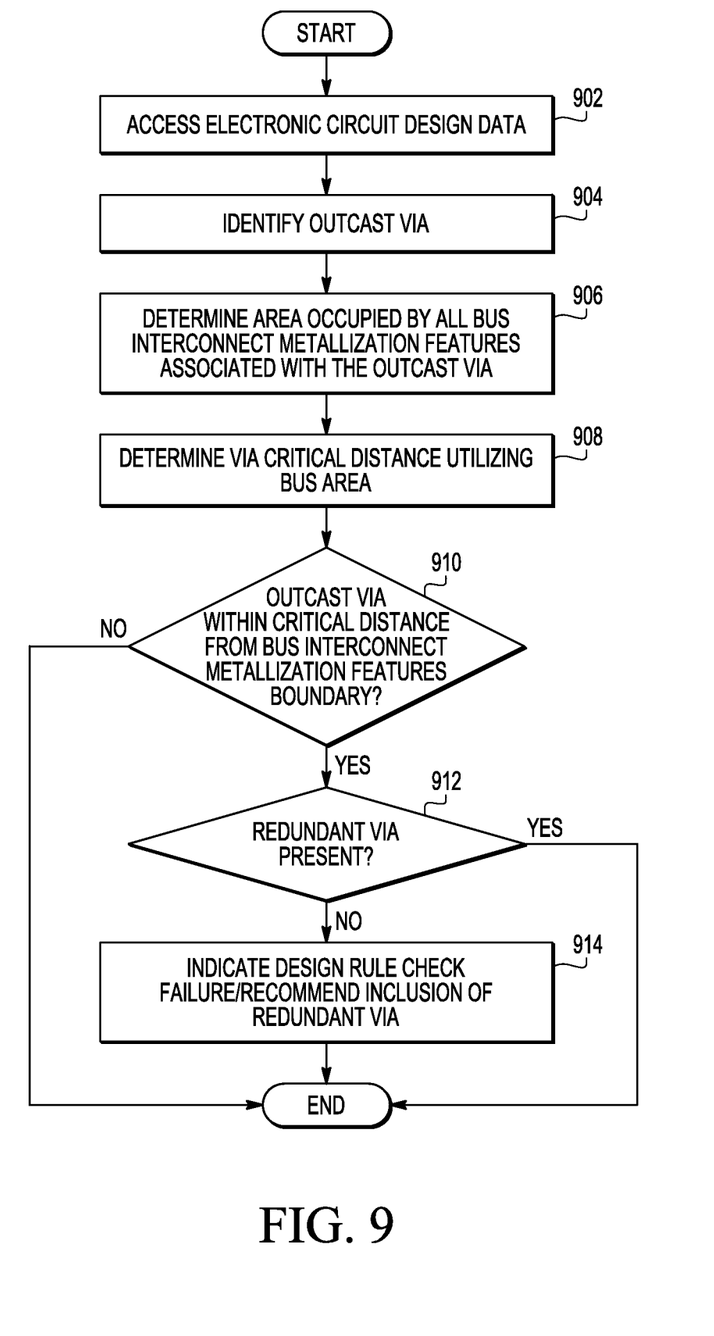
FIG. 9 illustrates a high-level flow chart of a method for processing an electronic circuit design according to an embodiment of the present invention.

FIG. 9 illustrates a high-level flow chart of a method for processing an electronic circuit design according to an embodiment of the present invention. In the depicted embodiment, the process is initiated and electronic circuit design data is accessed (process block 902). Such electronic circuit design data may be formatted in any of a number of data formats, for example Graphic Database System II or "GDSII" Stream format. In one embodiment, such electronic circuit design data is accessed utilizing a DRC or EDA software application. An "outcast" via as previously described herein is identified shown as process block 904 utilizing the accessed electronic circuit design data. Thereafter an area occupied by all bus interconnect metallization features associated with the identified outcast via is determined (process block 906). As previously described, an interconnect metallization feature may be considered "associated" with a selected outcast via based on a number of different criteria in various embodiments of the present inventive subject matter.

In the illustrated process embodiment of FIG. 9, a critical distance for the via is then determined as shown as process block 908. It is then determined whether the outcast via being evaluated is within or outside of the identified critical distance shown as process block 910. If the via metallization feature is outside the threshold/critical distance the depicted process is completed, otherwise a determination is made whether a redundant via is present within the electronic circuit design which will mitigate the possibility of stress-migration related failures at the via shown as process block 912. If one or more additional vias are present, again the illustrated process is completed, otherwise, an indication is made, for example by utilizing the DRC or EDA software application user interface, of at least one of a DRC failure or a recommendation to include such a redundant via metallization feature shown as process block 914 before the process is completed.

Figure 10:
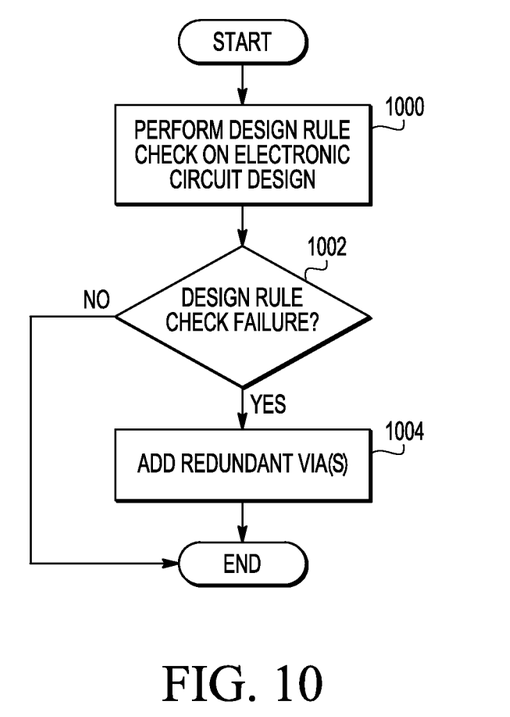
FIG. 10 illustrates a high-level flow chart of a method for producing electronic circuits according to an embodiment of the present invention.

FIG. 10 illustrates a high-level flow chart of a method for producing electronic circuits according to an embodiment of the present invention. In the depicted process embodiment of the figure, a design rule check (DRC) is performed on an electronic circuit design utilizing an area of a feature, for example a bus interconnect metallization feature, as previously described per one or more embodiments of the present inventive subject matter shown as process block 1000. A determination is then made based on the DRC whether a failure has occurred shown as process block 1002. In response to a DRC failure indicating, for example, that a via metallization feature subject to DRC evaluation is within a critical or threshold distance of a bus interconnect metallization feature, a redundant via metallization feature is automatically added to the electronic circuit design shown as process block 1004 before the illustrated process is completed.

Although the invention is described herein with reference to specific embodiments, various modifications and changes can be made without departing from the scope of the present inventive subject matter as set forth in the claims below. For example, while the embodiments described herein are indicated with regard to selected metallization network material types and process geometries, alternative embodiments may be implemented within any electronic circuit design context in which via metallization features or similar structures may be placed. Similarly, while selected embodiments have been described as utilizing redundant via placement and/or DRC compliance, other techniques may be utilized to address potential stress migration-related failures in other embodiments. Moreover, while embodiments described herein primarily indicate a determination of critical distance utilizing an area of an associated bus metallization feature, in alternative embodiments additional areas such as those of associated tab metallization features may also be utilized for such a determination or otherwise factored into such a determination such as an adjustment to such a determined distance. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

What is claimed is:

1. A computer-implemented method for processing an electronic circuit design, said computer-implemented method comprising:

accessing, utilizing a computer, data which represents said electronic circuit design;

identifying a via metallization feature on a tab metallization feature, wherein the tab metallization feature extends laterally from at least one bus interconnect metallization feature of said electronic circuit design utilizing said data which represents said electronic circuit design; and evaluating a spacing design rule check on said via metallization feature of said electronic circuit design utilizing an area occupied by said at least one interconnect metallization feature, wherein:

the area is defined by multiplying a lesser of an actual length or threshold length of the bus interconnect metallization feature with a width of the at least one bus interconnect metallization feature; and the threshold length is a length at which a probability of vacancies originating in the bus metallization feature will migrate to the via metallization feature is below an acceptable threshold.

2. The computer-implemented method of claim 1, further comprising:
adding a redundant via metallization feature, positioned on said tab interconnect metallization feature, to the data which represents said electronic circuit design if the area exceeds a predetermined threshold.

3. A computer program product comprising instructions stored in a non-transitory computer readable medium which, when executed by a processor, causes the processor to execute a method for processing an electronic circuit design, the method comprising:
accessing, utilizing a computer, data which represents said electronic circuit design;
identifying a via metallization feature on a tab metallization feature, wherein the tab metallization feature extends laterally from at least one bus interconnect metallization feature of said electronic circuit design utilizing said data which represents said electronic circuit design; and
evaluating a spacing design rule check on said via metallization feature of said electronic circuit design utilizing an area occupied by said at least one interconnect metallization feature, wherein
the area is defined by multiplying a lesser of an actual length or threshold length of the bus interconnect metallization feature with a width of the at least one bus interconnect metallization feature; and
the threshold length is a length at which a probability of vacancies originating in the bus metallization feature will migrate to the via metallization feature is below an acceptable threshold.

4. The computer program product of claim 3, the method further comprising:
adding at least one redundant via metallization feature, positioned on said tab interconnect metallization feature, in response to a determination that said area is greater than the a predetermined threshold.

5. A data handling system comprising:
a processing element;
a storage element, coupled to said processing element; and
an electronic design automation computer program product, comprising instructions stored in said storage element which, when executed by said processing element, causes the processing element to execute a method for processing an electronic circuit design, the method comprising:
accessing, utilizing a computer, data which represents said electronic circuit design;
identifying a via metallization feature on a tab metallization feature, wherein the tab metallization feature extends laterally from at least one bus interconnect metallization feature of said electronic circuit design utilizing said data which represents said electronic circuit design; and
evaluating a spacing design rule check on said via metallization feature of said electronic circuit design utilizing an area occupied by said at least one interconnect metallization feature, wherein
the area is defined by multiplying a lesser of an actual length or threshold length of the bus interconnect metallization feature with a width of the at least one bus interconnect metallization feature; and
the threshold length is a length at which a probability of vacancies originating in the bus metallization feature will migrate to the via metallization feature is below an acceptable threshold.

6. The data handling system of claim 5, said method further comprising:
adding at least one redundant via metallization feature, positioned on said tab interconnect metallization feature, in response to a determination that said area is greater than the a predetermined threshold.

\* \* \* \* \*